United States Patent [19]
Dornberger et al.

[11] Patent Number: 5,951,753
[45] Date of Patent: *Sep. 14, 1999

[54] METHOD AND DEVICE FOR PRODUCING MONOCRYSTALS

[75] Inventors: Erich Dornberger, Burghausen; Hans Ölkrug, Tittmoning; Wilfried Von Ammon; Dieter Gräf, both of Burghausen, all of Germany

[73] Assignee: Wacker Siltronic Gesellschaft für Halbleitermaterialien AG, Burghausen, Germany

[*] Notice: This patent is subject to a terminal disclaimer.

[21] Appl. No.: 08/854,287

[22] Filed: May 9, 1997

[30] Foreign Application Priority Data

Jun. 6, 1996 [DE] Germany .................. 196 22 664

[51] Int. Cl.⁶ .................................................. C30B 15/14
[52] U.S. Cl. .................... 117/3; 117/35; 117/217
[58] Field of Search .................. 117/35, 3, 217

[56] References Cited

U.S. PATENT DOCUMENTS

| | | | |
|---|---|---|---|
| 3,342,559 | 9/1967 | Dermatis | 117/217 |
| 4,597,949 | 7/1986 | Yasinsui et al. | |
| 4,784,715 | 11/1988 | Stoll | 117/217 |
| 4,956,153 | 9/1990 | Yamagishi et al. | 117/217 |
| 4,981,549 | 1/1991 | Yamashita et al. | 117/3 |
| 5,575,847 | 11/1996 | Kuramuchi et al. | 117/217 |

FOREIGN PATENT DOCUMENTS

| | | |
|---|---|---|
| 0229322 | 7/1987 | European Pat. Off. . |
| 0504837 | 5/1992 | European Pat. Off. . |
| 0504837 | 9/1992 | European Pat. Off. . |
| 0531525 | 4/1994 | European Pat. Off. . |
| 0612867 | 8/1994 | European Pat. Off. . |
| 3905626 | 8/1989 | Germany . |
| 3-65593 | 3/1991 | Japan ................. 117/217 |

OTHER PUBLICATIONS

Derwent Abstract Corresponding to DE-3905626 (#89-257051).
Patent Abstract of Japan (05330975).
Patent Abstract of Japan (03153595).
Recognition of D dejects in Silicon Single Crystals by Preferential Etching and Effect on Gate Oxide Integrity H. Yamagishi et al Semicond. Sci. Technol. 7 (1992) A 135–A 140, Printed in the UK.
Global Modelling of Heat transfer in Crystal Growth Furnaces, F. Dupret, Int. J. Heat Mass Transfer vol. 33, , No. 9, pp. 1849–1871, 1990 Printed in Great Britain.

*Primary Examiner*—Robert Kunemund
*Attorney, Agent, or Firm*—Collard & Roe, P.C.

[57] ABSTRACT

A method for producing a silicon monocrystal has a growing monocrystal kept for a specified dwell time in the specified temperature range of from 850° C. to 1100° C. This dwell time for the growing monocrystal in the chosen temperature range is either greater than 250 min or less than 80 min. A device and a method, in which the cooling rate of the growing monocrystal is to be influenced, has a heat shield which is subdivided into adjacent annular zones between a lower rim and an upper rim. These adjacent zones differ in regard to each's thermal conduction and transparency to heat radiation.

3 Claims, 1 Drawing Sheet

METHOD AND DEVICE FOR PRODUCING MONOCRYSTALS

BACKGROUND OF THE INVENTION

1. Field of the Invention

The present invention relates to a method for producing silicon monocrystals having a specified defect density. The present invention also relates to a device or apparatus for carrying out the method.

2. The Prior Art

Silicon monocrystals are produced in most practical cases by a crucible pulling method (called Czochralski method or CZ method) or by a crucible-free pulling method (called zone-melting method or FZ method). The rod-shaped monocrystals having diameters of typically 100 to 300 mm serve principally as basic material for producing wafers, from which electronic components are in turn manufactured. On examining the monocrystals and the wafers more closely, defects of varying types and sizes and in varying density (number per spatial or area unit) are found which have been produced during the pulling of the monocrystal.

In connection with the present invention, mention should first be made of the flow pattern defects (hereinafter abbreviated to "FPD"). These can be made visible as etch points having wedge-shaped etching tails after 30 min of Secco etching (H. Yamagishi, I. Fusegawa, N. Fujimaki and M. Katayama, *Semicond. Sci. Technol.* 7 (1992) A 135). The FPD density directly influences the breakdown strength of an oxide film produced on a silicon wafer. An important, criterion for assessing the breakdown strength is the so-called GOI yield ("gate oxide integrity"). At high FPD densities, the GOI yields are low. Wafers which are provided for producing electronic components ("prime wafers") should have as high GOI yields as possible because the yield of serviceable components also depends on high GOI yields. However, the GOI yield for test wafers ("monitor wafers"), which are used not to produce electronic components but only to check the component production processes, is of rather subordinate importance.

EP-504 837 A2 discloses the fact that dwell times of the growing monocrystal at temperatures of over 1150° C. have a favorable influence on the GOI yield. Anotlier class of defects includes the light point defects (abbreviated to "ILPD" hereinafter), which can be detected on polished wafer surfaces using optical measuring instruments. If light point defects can be detected in high density, the wafers concerned are regarded as inferior both for use as prime welfers and for use as monitor wafers, unless the magnitude of the LPD is predominantly in a range of less than 0.12 μm. In this case, use of the wafers as monitor wafers is quite possible since the defects are not harmful because their size is below the currently standard line width of component structures. In addition, the number of these LPDs can be considerably reduced and the GIO yield increased at the same time by a special heat treatment (annealing), so that wafers treated in this way are also suitable as prime wafers.

SUMMARY OF THE INVENTION

It is an object of the present invention to improve the production of silicon monocrystals in such a way that wafers which are cut from a pulled monocrystal either exhibit a particularly high GOI yield and are therefore particularly well suited as prime wafers or have LPDs whose magnitude is predominantly in the range of less than 0.12 μm, so that use as monitor wafers and possibly also use as prime wafers is particularly applicable.

The present invention relates to a method for producing a silicon monocrystal, comprising keeping a growing monocrystal for a specified dwell time, or residence time, within a specified temperature range, and maintaining the temperature range from 850° C. to 1100° C. and maintaining the dwell time of the growing monocrystal in the chosen temperature range to be either greater than 250 min or less than 80 min.

It is particularly preferred that the range of from 900° C. to 1050° C. is chosen as temperature range and the dwell time or residence time in this temperature range is either greater than 150 min or less than 50 min.

If the dwell time or residence time of the growing monocrystal in the temperature range of from 850° C. to 1100° C. is greater than 250 min, the silicon wafers cut from the monocrystal have very low FPD densities and very high GOI yields. They are therefore very well suited as prime wafers. On the other hand, if the dwell time in this temperature range is shortened to less than 80 min, very high LPD densities are found in the wafers cut from the monocrystal. These wafers are very well suited as monitor wafers because the size of the defects is predominantly less than 0.12 μm. Use of the wafers as prime wafers is also possible, provided the number of defects is reduced by a heat treatment of the wafers at approximately 1100° C. to 1200° C. in argon atmosphere or hydrogen atmosphere.

The determination of the dwell time can be critically influenced by the pulling speed and the thermal screening of the growing monocrystal. The higher the pulling speed is, the shorter the dwell time or residence time becomes for the growing monocrystal in a specified temperature range. The rate at which the growing monocrystal cools depends critically on the thermal screening of the monocrystal. It is therefore particularly necessary to take into consideration the screening of a heating source, for example a crucible heating system.

From the pulling of silicon monocrystals by the CZ method, heat shields are known in various constructions which are used to thermally shield the growing monocrystal. The more heat-transparent the heat shield is to heat radiation and thermal conduction, the more slowly a growing section of the monocrystal cools and the longer the temperature of this section remains in a specified temperature range. The appropriate harmonization of pulling speed and thermal screening of the monocrystal to achieve the dwell or residence time envisaged in the temperature range envisaged is facilitated by preliminary computer simulations and trials. A suitable simulation program can be developed, for example, on the basis of model calculations by Dupret et al. (Dupret et al., *Int. J. Heat Mass Transfer*, Vol. 33, No. 9, pages 1849–1871, 1990).

Particular attention should be paid. to the values which the heat shield has in regard to thermal conductivity and transparency to heat radiation. Known materials for heat shields are, for example, molybdenum sheet, graphite and graphite felt. Some heat shields are constructed as composite body laminates of such materials.

According to the present invention, there has now been developed an improved heat shield which is particularly suitable for carrying out the method of the present invention.

The present invention also relates to an apparatus or device for producing a silicon monocrystal comprising a heat shield for surrounding a growing monocrystal, said heat shield being subdivided into at least two adjacent annular zones or segments between a lower rim of the heat shield and an upper rim of the heat shield; and said adjacent annular zones differ from one another in regard to each's thermal conductivity and transparency to heat radiation.

The improved heat shield has the advantage that it is always possible to influence the temperature variation with time (the temperature history) in a specified section of the growing monocrystal during the pulling operation.

The present invention therefore also relates to a method for producing a silicon monocrystal, comprising influencing a cooling rate of a growing monocrystal by a heat shield which surrounds the growing monocrystal; and subdividing the heat shield into adjacent annular zones between a zone at a lower rim of the heat shield and a zone at an upper rim of the heat shield and adjacent zones differing from one another in regard to each's thermal conduction and transparency to heat radiation.

Known heat shields are composed of homogeneous material having uniform properties in regard to thermal conduction and transparency to heat radiation. The heat shield according to the present invention is subdivided into at least 2, preferably 2 to 5, annular zones. Thus, for example, when starting from the lower rim of the heat shield, there would be a first zone and above that follows a second zone which can be next to the upper rim of the heat shield.

A particular characteristic if there are several zones or segments is that two adjacent zones or segments differ in regard to thermal conduction and transparency to heat radiation. Thus, for example, a repeated sequence of zones with strong thermal insulation and less; strong or even weaker thermal insulation is possible in order to adjust the cooling rate of the growing monocrystal for a desired defect distribution and defect density at constant pulling speed.

The heat shield according to the invention may be made up of annular segments or zones which are disposed one above the other. Adjacent segments are composed of materials which differ in regard to thermal conduction and transparency to heat radiation. That two segments are connected only by means of struts so that the open gap between the segments acts as a zone with particularly high transparency to heat radiation is an additional embodiment. Optionally, a segment may also be actively cooled or heated by using a cooling means or a heating means respectively. A control system may be provided with which the cooling efficiency or the heating efficiency of the heat shield is matched to the requirements of the desired cooling rate of the monocrystal.

A heat shield according to the present invention is also produced if suitable segments or zones are provided in a known heat shield by active cooling or active heating. A requirement in this connection is, however, that the cooling or heating remains limited essentially to the particular zone of the heat shield and is not immediately transmitted to adjacent zones by thermal conduction.

The heat shield of the invention has proved particularly advantageous for pulling by the CZ method, in particular if pulling is carried out at speeds of more than 0.5 mm/min. According to the discovery of the inventors, the radial temperature gradient must be as high as possible on the surface of the melt around the phase boundary between the monocrystal and the melt so that the monocrystal grows cylindrically and does not form any bulges directed transversely to the direction of growth.

With a preferred embodiment of the heat shield, it is possible to ensure a high radial temperature gradient and, consequently, a stable crystal growth even at pulling speeds at which the use of a known prior art heat shield would result in an unstable crystal growth. This preferred embodiment is one wherein the zone at the lower rim of the heat shield, which is closest to the phase boundary between the monocrystal and the melt, has an emission coefficient of 0.3 to 0.9 and a thermal conductivity of 0.02 to 5 $Wm^{-1}$ $K^{-1}$ and therefore has special thermally insulating action.

BRIEF DESCRIPTION OF THE DRAWINGS

Other objects and features of the present invention will become apparent from the following detailed description considered in connection with the accompanying drawing which discloses the embodiments of the present invention. It should be understood, however, that the drawing is designed for the purpose of illustration only and not as a definition of the limits of the invention.

In the drawings.

DETAILED DESCRIPTION OF PREFERRED EMBODIMENTS

Figure 1:
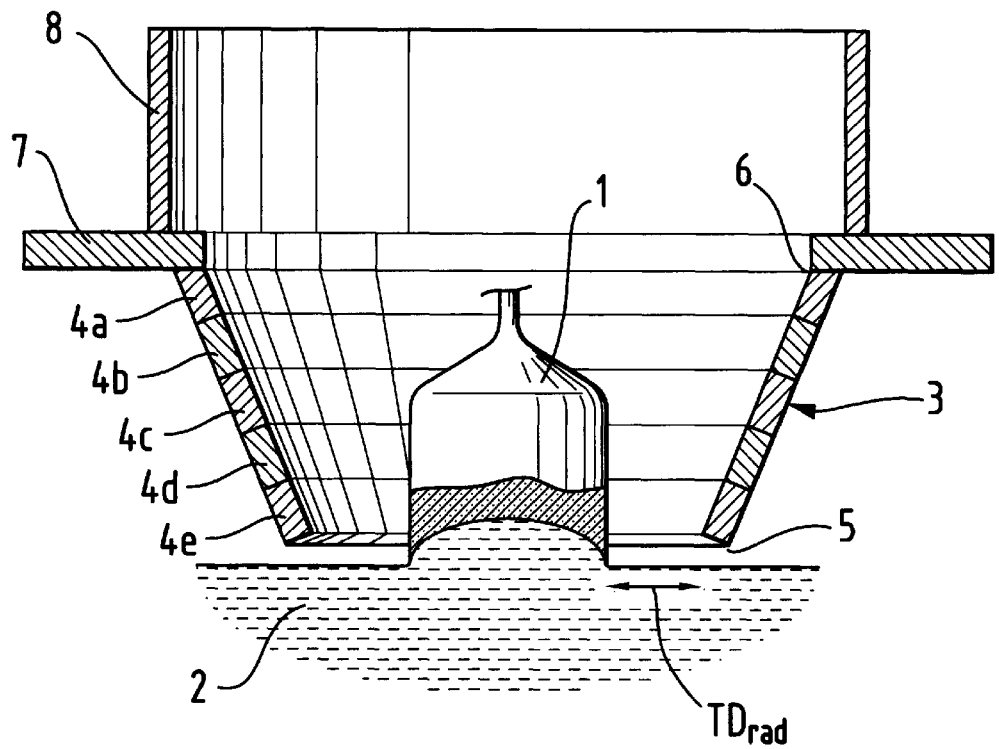
FIG. 1 shows in a longitudinal sectional view, the invention apparatus useful for a pulling system for pulling a monocrystal by the CZ method.

Turning now in detail to the drawings, FIG. 1 shows a longitudinal sectional view, the invention apparatus of a pulling system for pulling a monocrystal by the CZ method. The invention can, however, also be used in the FZ method. Only the features essential to the understanding of the invention are shown since the basic construction of pulling systems for producing monocrystals both by the CZ method and by the FZ method has long been known from many prior art publications.

The growing monocrystal 1, which is pulled from a melt 2 can be seen in FIG. 1. As particular features of the apparatus or device, only a heat shield 3, a cover 7 and an additional insulation 8 are shown. The monocrystal is surrounded by the heat shield 3. At its upper rim 6, the heat shield is supported by attachment to the cover 7, which divides the surrounding space of the pulling system into a lower part and an upper part. In the upper part of the pulling system, the monocrystal is thermally shielded by the heat shield 3 and optionally by the additional insulation 8. The temperature history and temperature gradient in the cooling of the monocrystal can be influenced by the heat shield and also by the additional insulation.

According to the invention, the heat shield 3 is subdivided into adjacent annular zones between the lower rim 5 and the upper rim 6, with adjacent zones differing between one to another in regard to thermal conduction and transparency to heat radiation. The heat shield shown in FIG. 1, is a preferred embodiment, and comprises five adjacent annular segments or zones 4a, 4b, 4c, 4d, and 4e, which are disposed one above the other. Segment 4a is adjacent to the upper rim 6 while segment 4e is adjacent to the lower rim 5. Segment 4c is in the middle of the heat shield 3, and segment 4b is between segments 4a and 4c, while segment 4d is between segments 4e and 4c. Each segment also forms a zone having specified thermal conductivity and transparency to heat radiation. The materials for the construction of the segments are preferably selected from a group which comprises graphite, graphite felt, quartz, silicon, CFC, molybdenum, silver and a composite structure laminate of two or more of these materials. The material to construct each zone is selected to be different enough such that the adjacent zones or segments have the desired different properties of thermal conduction and transparency to heat radiation.

It is preferable that the segment 4e at the lower rim 5 of the heat shield has special thermally insulating action so that the radial temperature distribution or gradient, denoted in FIG. 1 as "$TD_{rad}$" is as high as possible on the surface of the melt around the phase boundary between the monocrystal and the melt.

Other objects and features of the present invention will become apparent from the following Example, which discloses the embodiments of the present invention. It should be understood, however, that the Example is designed for the purpose of illustration only and not as a definition of the limits of the invention.

EXAMPLE

Silicon monocrystals having diameters of 150 mm to 300 mm were pulled by the CZ method and cut into wafers. During a pulling operation, the pulling speed remained constant. The residence or dwell times for the monocrystals varied within the temperature range from 900° C. to 1050° C. The density of the GOI defects was examined in the wafers obtained.

Figure 2:
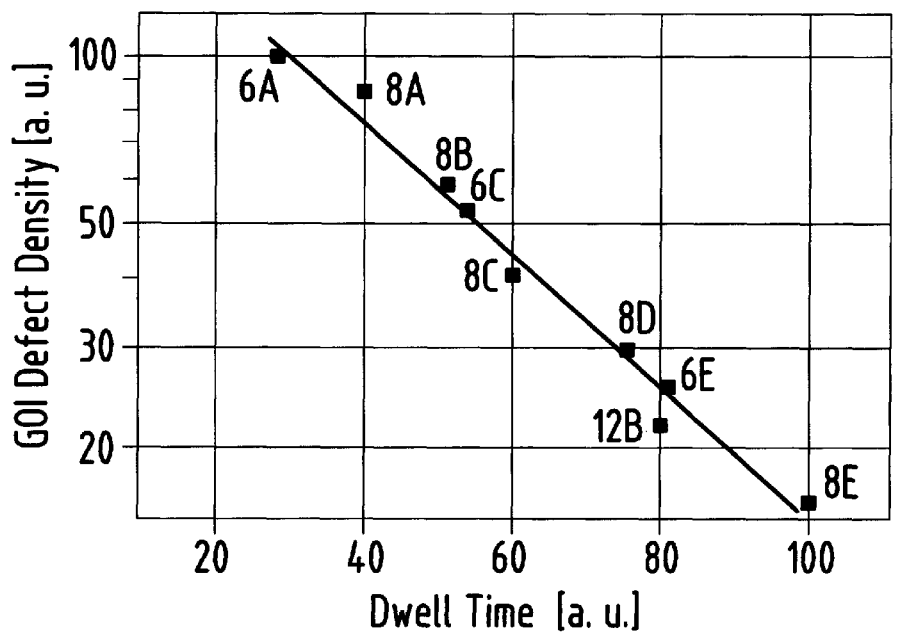
FIG. 2 shows the empirical results of an example described infra and shows a diagram in semilog scale in which the density of the GOI defects is plotted as a function of the dwell time of the growing monocrystal in the temperature range from 900° C. to 1050° C.

The empirical results of the determination are shown in semilog scale in FIG. 2. Placed in front of every measured value shown is an alphanumeric which describes the diameter of the pulled monocrystal. The numbers 6, 8 and 12 stand for a diameter of 150 mm, 200 mm and 300 mm, respectively. The letter (A to E) following a number denotes a specified thermal screening of the monocrystal. Defect densities and dwell times in FIG. 2 are specified in normalized units, or "adjusted units" (a.u.).

It can clearly be seen that the defect density depends on the dwell time of the monocrystal in this temperature range. For a short dwell time, the defect density was very high and, consequently, the GOI yield was low. However, the size of the defects remained essentially below 0.12 $\mu$m, so that these wafers were suitable as monitor wafers. Then, after a heat treatment at approximately 1100° C. in a hydrogen atmosphere, these wafers were also very well suited to be primary wafers. The lowest defect densities and highest GOI yields were found in wafers which originated from monocrystals whose dwell time in the temperature range from 900° C. to 1050° C. was longer than 150 min. These wafers were very well suited to be prime wafers.

While several embodiments of the present invention have been shown and described, it is to be understood that many changes and modifications may be made thereunto without departing from the spirit and scope of the invention as defined in the appended claims.

What is claimed is:

1. A method for producing a silicon monocrystal comprising keeping a growing monocrystal for a dwell time within a temperature range of from 850° C. to 1100° C.; and maintaining the dwell time of the growing monocrystal in said temperature range to be greater than 250 min.

2. A method for producing a silicon monocrystal comprising keeping a growing monocrystal for a dwell time within a temperature range of from 850° C. to 1100° C.;

maintaining the dwell time of the growing monocrystal in said temperature range to be less than 80 min;

cutting wafers from the silicon monocrystal; and annealing the wafers in an atmosphere selected from the group consisting of argon and hydrogen.

3. A method for producing a silicon monocrystal comprising keeping a growing monocrystal for a dwell time within a temperature range of from 850° C. to 1100° C.; and maintaining the dwell time of the growing monocrystal in said temperature range to be greater than 150 min.

* * * * *

UNITED STATES PATENT AND TRADEMARK OFFICE
CERTIFICATE OF CORRECTION

PATENT NO. : 5,951,753
DATED : September 14, 1999
INVENTOR(S) : DORNBERGER ET AL It is certified that error appears in the above-indentified patent and that said Letters Patent is hereby corrected as shown below:

On the title page, column 1, line 2 of Item [30], please change

"June 6, 1996" to --June 5, 1996--.

Signed and Sealed this

First Day of August, 2000

Attest:

Q. TODD DICKINSON

Attesting Officer

Director of Patents and Trademarks